United States Patent [19]
Sharpe

[11] 4,027,262
[45] May 31, 1977

[54] PHASE DETECTOR EMPLOYING QUADRUPLE MEMORY ELEMENTS

[75] Inventor: Claude A. Sharpe, Fort Lauderdale, Fla.

[73] Assignee: The Bendix Corporation, Southfield, Mich.

[22] Filed: Mar. 2, 1976

[21] Appl. No.: 663,181

[52] U.S. Cl. .............................. 328/133; 328/110; 307/247 R
[51] Int. Cl.² ........................................ H03K 5/20
[58] Field of Search .......... 307/232, 233 R, 233 A, 307/247 R; 328/110, 109, 133, 134, 155

[56] References Cited

UNITED STATES PATENTS

| | | | |
|---|---|---|---|
| 3,354,398 | 11/1967 | Broadhead | 328/133 |
| 3,458,823 | 7/1969 | Nordahl | 328/11 D X |
| 3,714,463 | 1/1973 | Laune | 307/232 |
| 3,735,324 | 5/1973 | Phillips | 328/133 |
| 3,755,746 | 8/1973 | Hogue et al. | 328/133 |
| 3,944,933 | 3/1976 | Gallet | 307/232 X |

*Primary Examiner*—John S. Heyman
*Attorney, Agent, or Firm*—Bruce L. Lamb; William G. Christoforo

[57] ABSTRACT

A phase detector which employs four memory elements suitably comprised by D-type flip-flops. The detector provides an output dependent upon the phase difference between two input signals. One pair of memory elements is clocked by one input signal. The other pair of memory elements is clocked by the other input signal. The memory elements are so arranged that when the ratio of the frequencies of the input signals is less than 2:1, the detector provides three output states which may be used in a phase locked oscillator to cause, in the first state, an increase in the frequency of one input signal; in the second state, no frequency change; and in the third state, a decrease in frequency. Above a frequency ratio of 2:1, the detector never enters the second state. Elimination of the second state under such conditions decreases the time required for a phase locked oscillator with this detector to achieve phase lock.

6 Claims, 4 Drawing Figures

PHASE DETECTOR EMPLOYING QUADRUPLE MEMORY ELEMENTS

The present invention relates generally to frequency synthesizers and particularly to an improved phase locked oscillator for use therein.

Frequency synthesizers are widely used in applications requiring a variable frequency oscillator having a broad frequency range and a highly stable, highly accurate output. The synthesizer known to the art which is closest in form to the present invention is described in some detail hereinafter in order that the improvement afforded by the invention may be better appreciated.

In brief, synthesizers of interest herein include a voltage controlled oscillator (VCO) and a phase detector which compares the phase of signal from the VCO with the phase of a reference signal and provides through feedback means an oscillator control voltage. In the steady state, the VCO signal is locked in phase with the reference signal and possesses both the accuracy and stability of the reference signal. when the frequency of the output signal of the synthesizer is to be changed, the frequencies of the signals applied to the phase detector may be greatly different and in order to broaden the capture range of the phase locked oscillator and to eliminate spurious signals therefrom which are harmonically rather than fundamentally related to the reference signal, a memory device is incorporated in the phase detector. The memory is capable of entering three states of output, the first of which may tend to increase the frequency of the VCO signal, the second of which will effect no frequency change and the third of which will decrease the frequency.

In the prior device, even when the ratio of frequencies of the inputs to the phase detector is very high, conditions combine to cause occasional brief transitions of the memory device output from the appropriate driving state (first or third state) to the second state and each such transition increases the time for the oscillator to reach a steady state synchronized condition.

It is therefore an object of the present invention to provide a phase locked oscillator capable of reaching a stable condition more rapidly than prior devices when subject to a command to change frequency by a large amount.

Another and more specific object of the invention is to provide a phase detector for a phase locked oscillator wherein the phase detector is capable of entering three output states whenever the ratio of the frequencies of input signals is two or less and which enters only one of two possible output states whenever the ratio of the frequencies of input signals is even incrementally greater than 2:1.

Other objects, such as simplicity and economy of production, will become evident as an understanding of the invention is gained through study of the following detailed description and the accompanying drawings.

Briefly, the prior phase detector for a phase locked oscillator included a memory device in the form of a pair of D-type flip-flops and an interconnecting logic gate. Signal from the VCO served as a clock for one of the flip-flops, while the reference signal clocked the other. The outputs of the flip-flops are combined in an integrator, the output of which constitutes the control voltage for the VCO. The logic gate is connected to reset the flip-flops whenever both flip-flops would otherwise transition to a 1 state. Thus, if the frequency of one of the detector input signals is high, the input to the integrator constsits of 1 interspersed with occasinal 0 outputs from the flip-flop clocked by the higher frequency signal. During this time the output from the other flip-flop remains at 0 since it is prevented from entering the 1 state by the logic gate reset circuit. In the present invention the memory device includes an additional pair of D-type flip-flops so arranged that whenever the ratio of frequencies of input signals to the detector is greater than 2:1, one of the additional flip-flops will be in a 1 state to continue to supply input to the integrator and thus fill in the 0's which occur in the prior detector under the same conditions. In the drawings:

Figure 1:
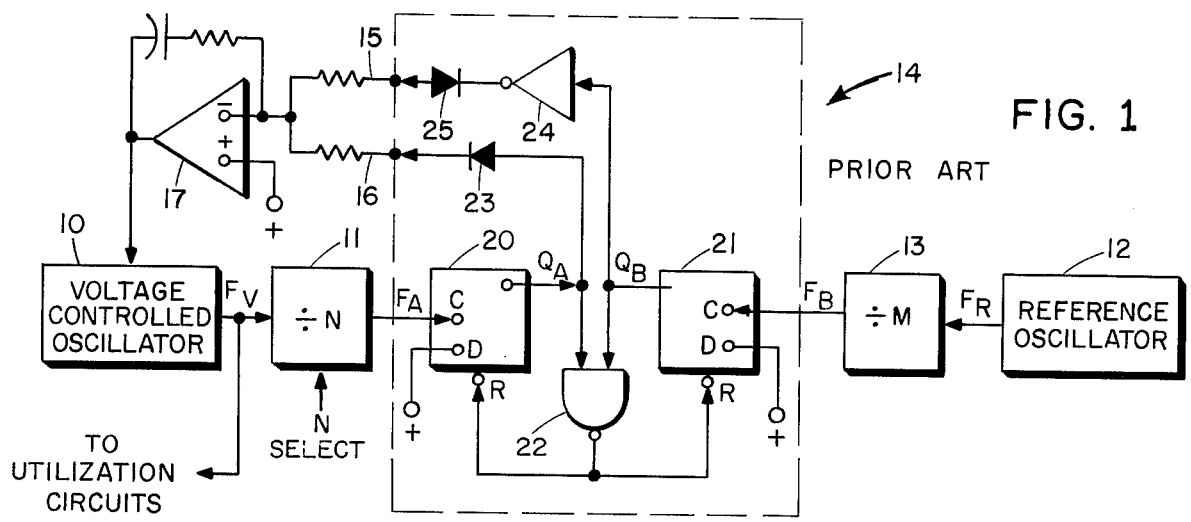
FIG. 1 is a functional block diagram of the frequency synthesizer including a phase detector of the recent prior art.

FIG. 1 illustrates a frequency synthesizer employing a phase detector of the recent prior art. A voltage controlled oscillator (VCO) 10 furnishes signal at frequency $F_v$ to a programmable divider 11 wherein the frequency of the input signal $F_v$ is divided by a factor N to provide output signal at frequency $F_a$. A highly stable, highly accurate reference osicllator 12 provides output signal of frequency $F_r$ which is divided by a factor M in divider 13 to produce a signal of frequency $F_b$. The relative phase of signals $F_a$ and $F_b$ are compared in phase detector 14 which produces impulses on inputs 15 and 16 to an integrator 17. The polarity of the integrator inputs is such as to cause a control voltage output from the integrator tending to reduce the frequency of VCO 10 whenever signal is present on input 16. Whenever signal is present on input 15, the opposite effect on the VCO frequency occurs.

The frequency of the output signal from the synthesizer is controlled by selecting an appropriate value for the factor N in divider 11 by means of an external control circuit. In the steady state frequencies $F_a$ and $F_b$ are precisely equal and locked in phase with one another. It is readily seen that the relationship $F_v = (N/M)F_r$ then applies. Therefore, limited only the range of frequencies through which the VCO can be controlled, the synthesizer can produce any desired output frequency through predetermination of the factors N and M.

Phase detector 14 of the recent prior art comprises a pair of D-type flip-flops 20 and 21. A D-type flip-flop has the property of transferring to the output thereof whatever value (1 or 0) is present on input D at the appearance of a clock pulse. Thus, if immediately before a clock pulse appears the flip-flop output is 0 and input D is 1, the appearance of a clock pulse will cause the output to transition to 1. If, prior to clock, input D is 1 and the output is 1, no change in the output occurs upon the appearance of the clock. If, prior to clock, input D is 0 and the output is 1, the clock will cause the flip-flop output to transition to 0. If, prior to clock, input D is 0 and the ouput is 0, no change occurs in the output upon the appearance of the clock. Those skilled in the art will recognize that other types of flip-flops are adaptable to the present purpose so long as edge triggering is provided.

Flip-flop 20 receives as clock input signal $F_a$, similarly flip-flop 21 receives signal $F_b$ as the clock input. The D inputs of both flip-flops are tied to a positive source providing an input value at all times equal to 1. Output $Q_a$ of flip-flop 20 and output $Q_b$ of flip-flop 21 are combined through a NAND gate 22, the output of which is connected to the reset inputs of each flip-flop. Flip-flop outputs $Q_a$ and $Q_b$ are thus both immediately reset to 0 whenever $Q_a$ and $Q_b$ attempt to become 1 simultaneously. Output $Q_a$ is connected through an isolating diode 23 to integrator input 16. Output $Q_b$ of flip-flop 21 is passed through an inverter 24 to provide output impulses opposite in polarity to those of $Q_a$ and thence through an isolating diode 25 to integrator input 15.

The operation of detector 14 will be described graphically hereinafter. It should be recognized that the detector possesses three output states. With the frequency $F_a$ higher than the frequency $F_b$ the detector is in the first state, wherein output impulses appear only on integrator input 16. When the input frequencies $F_a$ and $F_b$ are equal, the detector is in the second state wherein neither of the integrator inputs 15 or 16 are pulsed. When the point frequency $F_b$ is higher than the input frequency $F_a$, the detector is in the third state wherein output impulses are applied only to integrator input 15. Because of the reset connections through NAND gate 22 the integrator inputs 15 and 16 are not alternately pulsed as frequencies $F_a$ and $F_b$ approach equality. Rather, only that input necessary to correct a frequency or phase error is pulsed until the error is reduced to zero, whereupon the detector enters the second state continuously producing 0 output.

Assuming that frequency $F_a$ is higher than frequency $F_b$, at some point in time, more than one positive transition of the clock input to flip-flop 20 will occur between two positive transitions of clock input to flip-flop 21. Output $Q_a$ therefore becomes 1 upon the first such positive transition of $F_a$ and remains at that value until the appearance of a positive transition of $F_b$, whereupon $Q_a$ drops to 0 and remains at that value until the next positive transition of $F_a$. The occasional periods during which output $Q_a$ drops to 0 under these conditions lengthens the time required for integrator 17 to develop sufficient mangitude of control voltage to eliminate the frequency error. The improved detector of this invention is not subject to occasional transition into the "sound" output state when the ratio of input frequencies is greater than 2:1.

Figure 2:
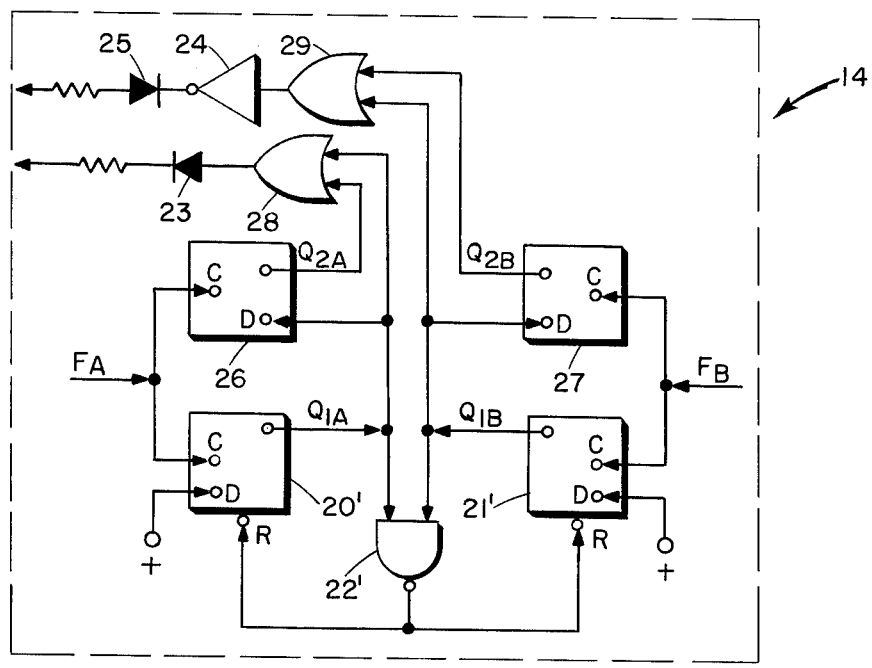
FIG. 2 is a functional block diagram of the improved phase detector of the present invention.

Referring to FIG. 2, the improved detector comprises a pair of D-type flip-flop 20' and 21' connected as in FIG. 1. Outputs $Q_{1a}$ and $Q_{1b}$ are connected to the D inputs of an additional pair of D-type flip-flops 26 and 27 and to OR gates 28 and 29. Flip-flops 26 and 27 respectively receive $F_a$ and $F_b$ as clock inputs. Outputs $Q_{2a}$ and $Q_{2b}$ are respectively connected as second inputs to OR gates 28 and 29. The outputs of OR gates 28 and 29 are respectively connected to isolating diode 23 and inverter 24 and the remainder of the synthesizer is as depicted in FIG. 1. As will now be shown graphically the additional flip-flops 26 and 27 provide continuous detector output of the proper driving state whenever the ratio of frequencies of the detector inputs is greater than 2:1.

Figure 3:
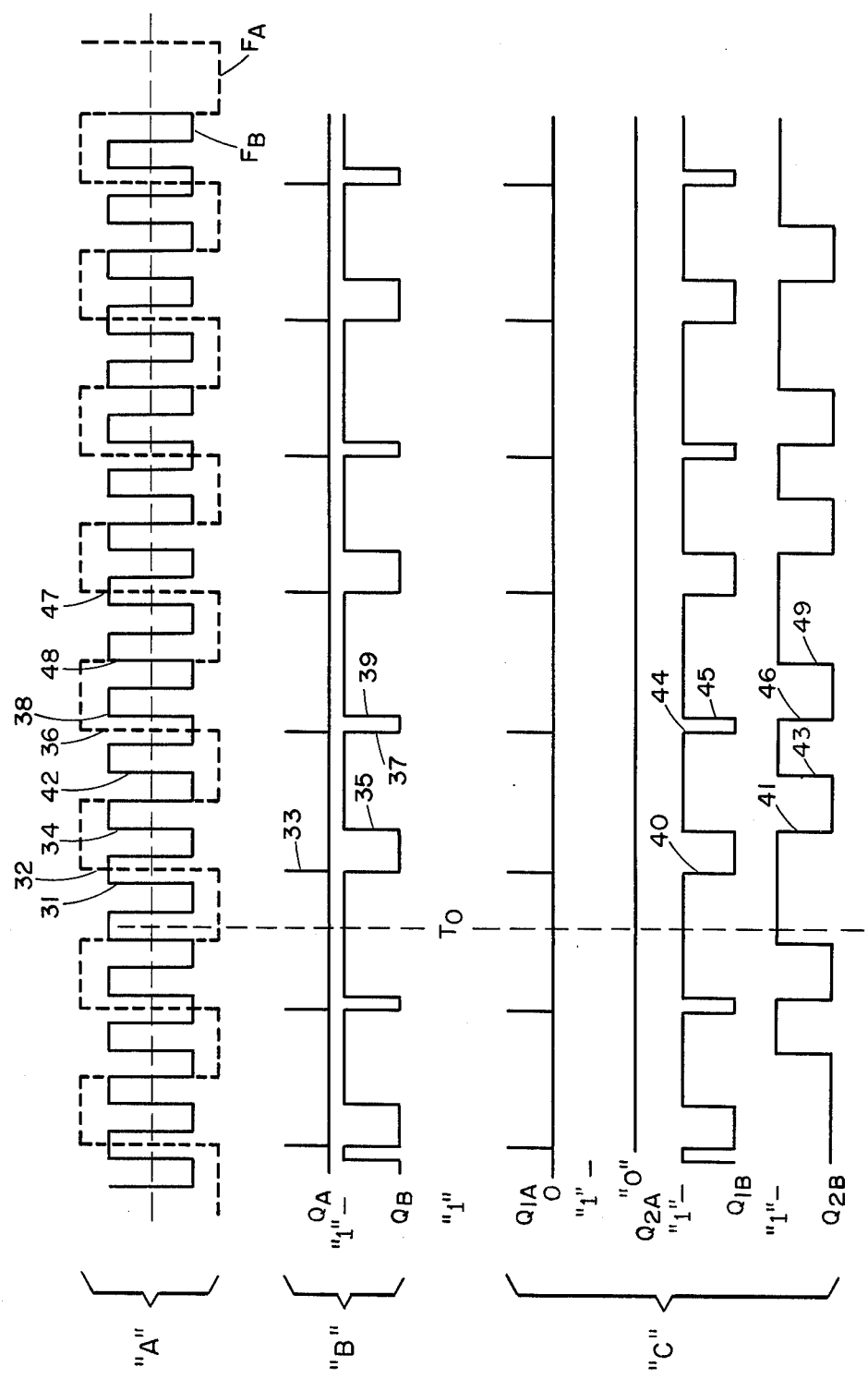
FIG. 3 is a waveform diagram helpful in explaining the operation of the phase detectors of FIGS. 1 and 2.

FIG. 3 is a waveform diagram comparing the operation of the FIG. 1 prior art detector with the detector of the present invention for an input frequency ratio $F_b:F_a$ greater than 2:1. The input signals are shown in trace A with different amplitudes for clarity of illustration. Trace B shows the outputs of flip-flops 20 and 21 of FIG. 1 which are applied respectively to diode 23 and inverter 24. Trace C illustrates the outputs of the detector of FIG. 2 for the same input conditions as trace B. Selecting an arbitrary starting time $T_0$, the initial condition for trace B is $Q_a = 0$ and $Q_b = 1$. The first positive transition 31 of $F_b$ occurring after $T_0$ causes no change in the outputs $Q_a$ and $Q_b$, since $F_b$ clocks only flip-flop 21 and prior to the appearance of the clock, $Q_b = 1$. The next input event is the appearance of a positive transition 32 of input $F_a$. Since the D input to flip-flop 20 is constant 1, clock pulse 32 attempts to set $Q_a$ to 1. However, the inputs to NAND gate 22 are then both true causing flip-flops 20 and 21 both to be immediately reset to 0. The reset action appears as a very short pulse 33 on $Q_a$, while $Q_b$ drops to 0. The next clock event is a positive transition 34 of $F_b$ which, because of the constant 1 D input to flip-flop 21 causes $Q_b$ (at 35) to be set to 1. Outputs $Q_a$ and $Q_b$ then remain constant at 0 and 1, respectively, until the next effective clock event which is a positive transition 36 of $F_a$. $Q_b$ is then reset (at 37) to 0 and continues in that state until the next effective clock pulse which is the positive transition 38 of $F_b$, again setting $Q_b$ (at 39) to 1.

Under the conditions of FIG. 3, $Q_a$ never equals 1 for a period of time long enough to produce any practical effect on the output of integrator 17 (FIG. 1). The intervals as between 33–35 and 37–39 during which $Q_b$ drops to 0 substrate from the average value of input voltage, $V_{avg}$, to integrator 17, thus increasing the time required for the integrator to develop control voltage of sufficient magnitude to eliminate the frequency error.

Outputs $Q_{1a}$, $Q_{2a}$, $Q_{1b}$ and $Q_{2b}$ are plotted in trace C. At the arbitrary time $T_0$, $Q_{1a}$ and $Q_{2a}$ are both 0 and $Q_{1b}$ and $Q_{2b}$ are both 1. Clock pulse 31 has no effect on either $Q_{1b}$ ad $Q_{2b}$ since both are at that time 1. Clock pulse 32, as in the case of tract B resets (at 40) $Q_{1b}$ to 0 but no change occurs in $Q_{2b}$ since no clock pulse is present in flip-flop 27. Clock pulse 34 sets $Q_{1b}$ to 1 and simultaneously sets (at 41) $Q_{2b}$ to 0 since the D input to flip-flop 27 was 0 just prior to the appearance of clock pulse 34. Positive transition 42, which had no effect in trace B, now is effective to set $Q_{2b}$ to 1 since the D input to flip-flop 27 is at that time 1. Clock pulse 36 causes $Q_{1b}$ to be reset (at 44) but has no effect on $Q_{2b}$. Clock pulse 38 sets (at 45) $Q_{1b}$ to 1 and sets (at 46) $Q_{2b}$ at 0. Before the next appearance of a positive transition 47 of $F_a$ which will cause reset of $Q_{1b}$ there is an intervening positive transition 48 which sets (at 49) $Q_{2b}$ to 1.

Although output $Q_{1b}$ is identical to output $Q_b$ of trace B, for input frequency ratios greater than 2:1, output $Q_{2b}$ will always be in a 1 state during the intervals $Q_{1b}$ is reset to 0. When outputs $Q_{1b}$ and $Q_{2b}$ are combined in OR gate 29 the result is a constant level 1 voltage input to inverter 24. The operation of the dectectors of FIGS. 1 and 2 is symmetrical so that if the frequency of $F_a$ was higher than the frequency of $F_b$, the waveforms of FIG. 3 would be the same except that those outputs $Q_a$, $Q_{1a}$ and $Q_{2a}$ showing constant 0 value would become active and similar in form to outputs $Q_b$, $Q_{1b}$ and $Q_{2b}$ and the latter outputs would become 0. Below an input frequency ratio of 2:1 the detectors of FIGS. 1 and 2 gradually become indistinguishable from one another in operation.

Figure 4:
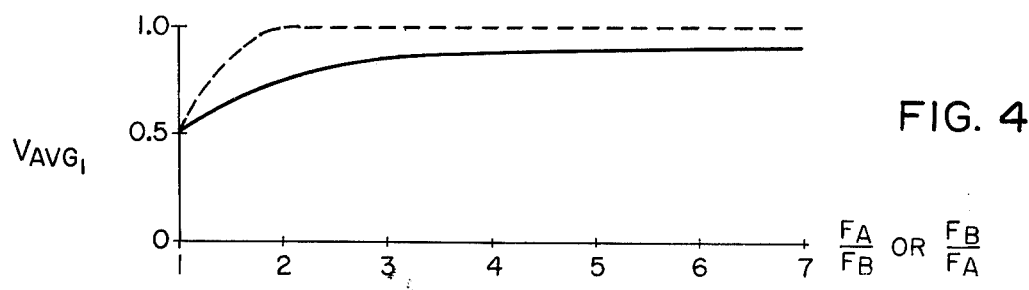
FIG. 4 is a plot of the normalized average voltage outputs of the phase detectors of FIGS. 1 and 2 for various ratios of input frequencies.

FIG. 4 is a plot of the normalized average voltage input, $V_{avg}$ against input frequency ratio for the detectors of FIGS. 1 and 2. The solid-line curve is a plot of the equation:

$$\text{Normalized } V_{avg} = 1 - \frac{F_a \text{ (freq.)}}{2F_b \text{ (freq.)}}.$$

The dashed-line curve is the normalized output of the detector of FIG. 2, showing that at a frequency ratio incrementally greater than 2:1 $V_{avg}$ is equal to the full normalized value. The difference between the values of these two curves represents the improvement in the rate of change of VCO control voltage provided by the invention.

The invention claimed is:

1. In a phase detector which includes a pair of preconditionable, resettable, clock pulse operated memory elements for comparing the phase of two input signals, one such signal providing clock pulses for one said memory element, the other such signal providing clock pulses for the other said memory element, the outputs of said memory elements constituting the phase detector outputs, the improvement comprising an additional pair of preconditionable, clock pulse operated memory elements;

means applying the output of one of said memory elements of said first-named pair to precondition one of said memory elements of said additional pair;

means applying one said input signal as clock pulses both to the one of said additional pair of memory elements and to the one of said first-named pair of memory elements serving to precondition said one of said additional pair of memory elements;

means combining the output of said one of said first-named pair of memory elements with the output of said one of said additional pair of memory elements, said combined outputs constituting one output of the improved phase detector;

means applying the output of the other of said memory elements of said first-named pair to precondition the other of said memory elements of said additional pair;

means applying the other said input signal as clock pulses both to the other of said memory elements of said additional pair and to the other of said first-named pair of memory elements; and means combining the output of the other of said memory elements of said additional pair with the output of the other of said memory elements of said first-named pair, said last-named combined outputs constituting the other output of the improved phase detector.

2. The improved phase detector as claimed in claim 1 wherein each said memory element of said first-named pair and said additional pair is comprised by a flip-flop operating in an edge triggered type D mode.

3. The improved phase detector as claimed in claim 1 wherein both said output combining means each comprises a logic gate of the OR type.

4. A phase detector for use in phase locked oscillators, and the like, providing an output dependent upon the relative phase of two input signals, comprising four memory elements, each of said memory elements having a clock input, a precondition input and an output, said output assuming the valve present at said precodition input upon the appearance of signal at said clock input and retaining such value after disappearance of signal at said clock input, at least two of said memory elements having reset means for removing output retained by that memory element;

a first pair of said memory elements, at least one of which includes reset means, receiving at said clock inputs thereof one of the signals whose phase is to be detected;

a second pair of said memory elements; at least one of which includes reset means receiving at said clock inputs thereof the other of the signals whose phase is to be detected;

means applying a signal of constant value to said precondition inputs to each said memory element having reset means;

means in each said first pair and said second pair of memory elements applying the output of said memory element having reset means to said precondition input of the remaining memory element of that pair;

logic means combining the outputs of said memory elements having reset means and providing signal to said reset means whenever said combined outputs are logically true for the logic AND operation;

means for combining the outputs of both said memory elements of said first pair to provide a detector output of a first state; and means for combining and inverting the outputs of both said memory elements of said second pair to provide a detector output of a second state.

5. A phase detector as claimed in claim 4 wherein said memory elements comprise flip-flops, said flip-flop operating in an edge triggered type D mode.

6. A phase detector as claimed in claim 4 wherein each said means for combining the outputs of said memory elements of said first and second pairs comprises a logic gate of the OR type.

* * * * *